(12) United States Patent
Cao (10) Patent No.: US 9,851,454 B2
(45) Date of Patent: Dec. 26, 2017

(54) DETECTION DEVICES AND METHODS

(71) Applicant: Lei Cao, Columbus, OH (US)

(72) Inventor: Lei Cao, Columbus, OH (US)

(73) Assignee: OHIO STATE INNOVATION FOUNDATION, Columbus, OH (US)

( * ) Notice: Subject to any disclaimer, the term of this patent is extended or adjusted under 35 U.S.C. 154(b) by 76 days.

(21) Appl. No.: 14/381,764

(22) PCT Filed: Feb. 28, 2013

(86) PCT No.: PCT/US2013/028198
§ 371 (c)(1),
(2) Date: Aug. 28, 2014

(87) PCT Pub. No.: WO2013/176719
PCT Pub. Date: Nov. 28, 2013

(65) Prior Publication Data
US 2015/0053863 A1    Feb. 26, 2015

Related U.S. Application Data (60) Provisional application No. 61/604,139, filed on Feb. 28, 2012.

(51) Int. Cl.
*G01T 1/24* (2006.01)
*G01T 3/08* (2006.01)
(Continued)

(52) U.S. Cl.
CPC .................. *G01T 1/24* (2013.01); *G01T 1/20* (2013.01); *G01T 3/06* (2013.01); *G01T 3/08* (2013.01);
(Continued)

(58) Field of Classification Search
CPC .... G01T 1/24; G01T 1/20; G01T 3/06; G01T 3/08; H01L 31/03044; H01L 27/1443; H01L 31/115
(Continued)

(56) References Cited

U.S. PATENT DOCUMENTS

| 3,390,270 A | * | 6/1968 | Treinen | G01T 3/006 |
|---|---|---|---|---|
| | | | | 250/370.04 |
| 4,581,532 A | * | 4/1986 | Givens | G01V 5/107 |
| | | | | 250/266 |

(Continued)

FOREIGN PATENT DOCUMENTS

| CA | 2214652 A1 | * | 9/1996 | ............... G01T 3/08 |
|---|---|---|---|---|
| DE | EP 0091029 A1 | * | 10/1983 | ............. G01T 3/006 |

OTHER PUBLICATIONS

PCT Notification Concerning Transmittal of International Preliminary Report on Patentability (Chapter 1 of the Patent Cooperation Treaty, (PCT Rule 44bis.1(c)), dated Sep. 12, 2014, Form PCT/IB/326 (Jan. 2004), 1 page.

(Continued)

*Primary Examiner* — David Porta
*Assistant Examiner* — Gisselle Gutierrez
(74) *Attorney, Agent, or Firm* — Fay Sharpe LLP (57) ABSTRACT

A device for detecting neutrons with gamma discrimination and/or gamma radiation includes a first semiconductor layer, a second semiconductor layer, an electron separator layer between the first semiconductor device and the second semiconductor device, and a gadolinium-containing layer between the first semiconductor layer and the second semiconductor layer.

20 Claims, 3 Drawing Sheets

(51) Int. Cl.
  *G01T 1/20* (2006.01)
  *G01T 3/06* (2006.01)
  *H01L 27/144* (2006.01)
  *H01L 31/0304* (2006.01)
  *H01L 31/115* (2006.01)

(52) U.S. Cl.
  CPC .... *H01L 27/1443* (2013.01); *H01L 31/03044* (2013.01); *H01L 31/115* (2013.01)

(58) Field of Classification Search
  USPC .................................................. 250/370.05
  See application file for complete search history.

(56) References Cited

U.S. PATENT DOCUMENTS

| | | | | |
|---|---|---|---|---|
| 5,659,177 | A * | 8/1997 | Schulte | G01T 3/08 250/370.05 |
| 7,772,558 | B1 * | 8/2010 | Nagarkar | G01T 1/20 250/361 R |
| 8,022,369 | B2 | 9/2011 | Orava et al. | |
| 8,389,946 | B2 * | 3/2013 | Friedman | G01T 1/185 250/382 |
| 8,507,872 | B2 * | 8/2013 | Feller | G01T 3/00 250/370.05 |
| 2006/0014938 | A1 * | 1/2006 | Groman | A61K 41/009 534/15 |
| 2006/0049362 | A1 * | 3/2006 | Friedman | C22C 19/05 250/374 |
| 2009/0179155 | A1 | 7/2009 | Weinberg | |
| 2011/0095194 | A1 * | 4/2011 | Orava | G01T 3/08 250/370.05 |
| 2011/0163242 | A1 | 7/2011 | Mao et al. | |
| 2011/0266643 | A1 | 11/2011 | Engelmann et al. | |
| 2011/0284755 | A1 * | 11/2011 | Stradins | G01T 3/08 250/370.05 |
| 2011/0309261 | A1 * | 12/2011 | Friedman | G01T 1/185 250/382 |
| 2012/0161013 | A1 * | 6/2012 | Huston | G01T 1/2033 250/362 |

OTHER PUBLICATIONS

PCT International Preliminary Report on Patentability, (Chapter 1 of the Patent Cooperation Treaty, (PCT Rule 44bis), dated Sep. 2, 2014, Form PCT/IB/373 (Jan. 2004) 1 page.
PCT Written Opinion of the International Searching Authority, (PCT Rule 43bis.1), dated Nov. 5, 2013, Form PCT/ISA/237 (Jul. 2011) 6 pages.
Wang et al. A Gadolinium Doped Superlattice GaN Schottky Diode for Neutron Detection, Transactions of the American Nuclear Society, vol. 104, Hollywood, Florida, Jun. 26-30, 2011, (retrieved on Oct. 29, 2013). Retrieved from <URL: http://mae.osu.edu/labs/nars/sites/nars.engineering.osu.edu/files/uploads/GaN%20for%20neutron%20detection.pdf>. pp. 209-210.
PCT International Search Report, PCT/US2013/028198 May 11, 2013, dated Nov. 5, 2013, 2 pages.
Written Opinion of the International Searching Authority, PCT/US2013/028198 May 11, 2013, dated Nov. 5, 2013, 6 pages.

* cited by examiner

DETECTION DEVICES AND METHODS

PRIORITY CLAIM

This application is a National Stage of International Application No. PCT/US2013/028198, filed Feb. 28, 2013, which claims priority to U.S. Provisional Patent Application No. 61/604,139, filed Feb. 28, 2012, each of which is incorporated herein by reference in its entirety.

BACKGROUND

The present disclosure relates to devices and methods for detecting neutrons and/or gamma radiation.

The worldwide expansion of nuclear energy to produce carbon-free electricity comes with the risk of nuclear proliferation. The advancement in deterring technologies, especially the ability to detect special nuclear materials, is critical in mitigating risks.

Nuclear radiation detection and/or monitoring is also critical in many other industries including hospitals where neutron and/or proton therapies are used, the nuclear energy industry, the scientific research industry, etc. Since neutrons are electrically neutral, detection generally requires a conversion medium which emits electrically charged particles upon exposure to neutrons.

Compressed helium-3 ($^3$He) is widely used as a standard medium for detecting neutrons, largely because of its large thermal neutron cross-section and insensitivity to gamma radiation, high efficiency, and durability. However, the high demand for $^3$He in homeland security and nonproliferation applications, and its widespread use in technologies such as cryogenics, spallation neutron sources, and magnetic resonance imaging (MRI) have caused a long-standing shortage of $^3$He. Thus, a replacement is urgently needed.

Alternatives such as boron-10 ($^{10}$B) and lithium-6 ($^6$Li) can be applied as coatings or dopants in compounds. However, they suffer from inefficiency caused by comparatively long neutron mean free paths relative to the short ranges of charged particles in the neutron conversion media and relatively low neutron capture cross-sections compared with Gd.

The conversion medium may be disposed in a semiconductor device. A measurement of current or voltage may be used in detecting neutron radiation. However, some semiconductor materials are sensitive to gamma radiation which makes isolating neutron radiation difficult. Additionally, $^3$He is a relatively scarce material.

It would be desirable to develop new devices and methods for neutron detection with gamma discrimination and/or gamma radiation detection.

BRIEF DESCRIPTION

The present disclosure relates to devices for detecting neutrons and/or gamma radiation. The devices include a first semiconductor device, a second semiconductor device, an electron separator layer between the first semiconductor device and the second semiconductor device, and a conversion layer including gadolinium between the first semiconductor device and the second semiconductor device. The semiconductor-based devices may provide a small, reliable, and field deployable system for a large neutron detection network.

Disclosed, in various embodiments, is a detection device including a first semiconductor device and a second semiconductor device. The detection device further includes an electron separator layer and a conversion layer. The electron separator layer and the conversion layer are located between the first and second semiconductor devices. The conversion layer includes gadolinium.

The conversion layer may be a coating layer deposited on the second semiconductor device.

In some embodiments, the conversion layer may be a gadolinium-doped structure, including but not limited to superlattice.

The electron separator layer may be a polymer layer. In some embodiments, the polymer of the polymer layer is a polyolefin (e.g., polyethylene or polypropylene).

In some embodiments, the electron separator layer includes a first surface and a second surface. The first surface is in physical contact with the conversion layer. The second surface is in physical contact with one of the first semiconductor device and the second semiconductor device.

In some embodiments, the conversion layer has a thickness from about 20 to about 40 µm.

The first semiconductor device and the second semiconductor device may each includes gallium nitride semiconductor layers.

Also disclosed in embodiments is a method for detecting neutrons. The method utilizes a detection device which includes a first semiconductor device and a second semiconductor device. The detection device further includes an electron separator layer and a conversion layer. The electron separator layer and the conversion layer reside between the first and second semiconductor devices.

The method includes applying a first, reverse bias voltage to the first semiconductor device and a second, reverse bias voltage to the second semiconductor device. The method further includes comparing a first signal from the first semiconductor device to a second signal from the second semiconductor device to detect neutron radiation. The electron separator functions to separate one of the semiconductor devices from internal conversion electrons.

In some embodiments, the electron separator layer is a polymer layer. The polymer may be a polyolefin (e.g., polyethylene or polypropylene).

The electron separator layer may include a first surface and a second surface. In some embodiments, the first surface is in physical contact with the conversion layer and the second surface is in physical contact with one of the first semiconductor device and the second semiconductor device.

In some embodiments, the conversion layer has a thickness from about 20 to about 40 µm.

The first semiconductor device and the second semiconductor device may include gallium nitride semiconductor layers.

Further disclosed in embodiments is a method for detecting gamma radiation. The method utilizes a detection device including a semiconductor device and a conversion layer disposed on the semiconductor device. The conversion layer comprises gadolinium.

The method includes applying a reverse bias voltage to the semiconductor device. The method further includes measuring a signal generated by K x-rays to determine the intensity of the gamma radiation.

In some embodiments, the conversion layer has a thickness from about 20 to about 40 µm.

A semiconductor layer of the semiconductor device may include gallium nitride.

These and other non-limiting aspects and/or objects of the disclosure are more particularly described below.

BRIEF DESCRIPTION OF THE DRAWINGS

The following is a brief description of the drawings, which are presented for the purposes of illustrating the exemplary embodiments disclosed herein and not for the purposes of limiting the same.

FIG. 1 is a schematic illustration of thermal neutron detection in an exemplary detection device of the present disclosure.

DETAILED DESCRIPTION

A more complete understanding of the processes and apparatuses disclosed herein can be obtained by reference to the accompanying drawings. These figures are merely schematic representations based on convenience and the ease of demonstrating the existing art and/or the present development, and are, therefore, not intended to indicate relative size and dimensions of the assemblies or components thereof.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The modifier "about" used in connection with a quantity is inclusive of the stated value and has the meaning dictated by the context (for example, it includes at least the degree of error associated with the measurement of the particular quantity). When used with a specific value, it should also be considered as disclosing that value. For example, the term "about 2" also discloses the value "2" and the range "from about 2 to about 4" also discloses the range "from 2 to 4."

The present disclosure relates to devices and methods for neutron detection with gamma discrimination and/or gamma radiation detection. The devices generally include a first semiconductor device, a second semiconductor device, a polymer layer between the first semiconductor device and the second semiconductor device, and a conversion layer between the first semiconductor device and the second semiconductor device. The conversion layer comprises gadolinium. In some embodiments, the conversion layer is a gadolinium coating layer on the top of one of the semiconductor devices.

Figure 1:
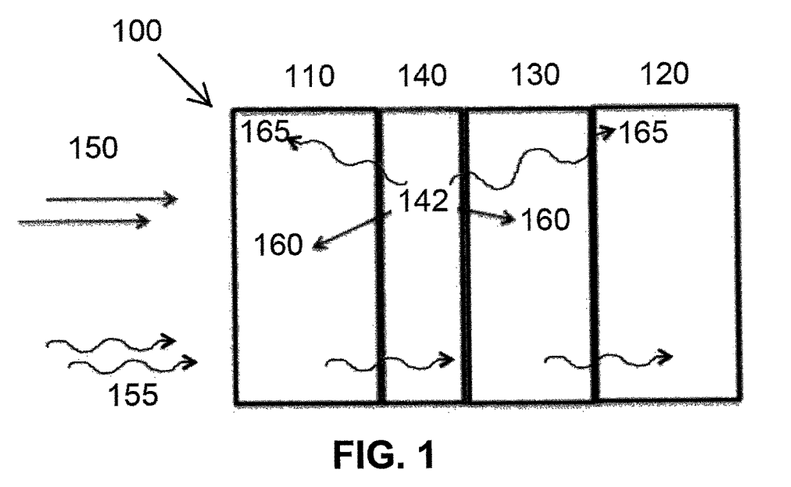
Figure 2:
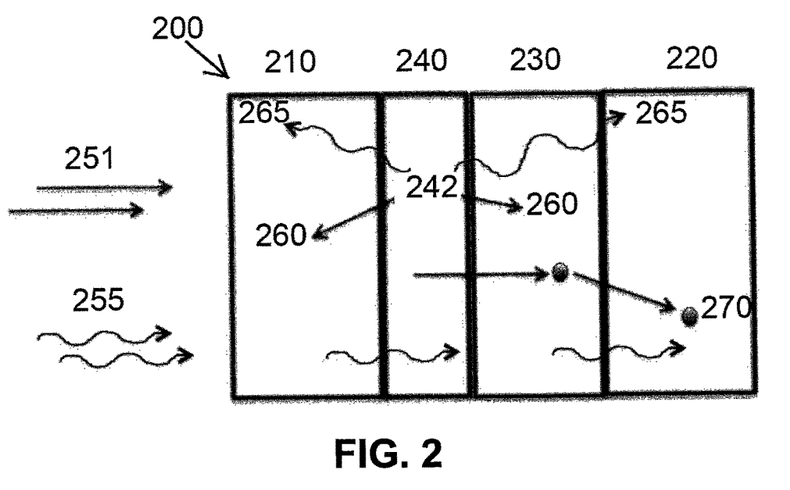
FIG. 2 is a schematic illustration of fast neutron detection in an exemplary detection device of the present disclosure.

FIGS. 1 and 2 are schematic drawings of an exemplary dual semiconductor detection device 100, 200 of the present disclosure. The dual semiconductor detection device depicted in FIGS. 1 and 2 includes a first semiconductor 110, 210 and a second semiconductor 120, 220. The device 100, 200 further includes a conversion layer 140, 240 and an electron separator layer 130, 230.

The first semiconductor device 110, 210 may include a first substrate and a first semiconductor layer. The first substrate may be a sapphire substrate and the first semiconductor layer may be a gallium nitride (GaN) semiconductor layer. In other embodiments, other substrate and/or semiconductor materials (e.g., silicon or silicon carbide) may be included.

The electron separator layer 130, 230 may be a polymer layer and functions as a separator and/or as a proton radiator. The polymer layer may include a plastic material. In some embodiments, the polymer layer comprises a polyolefin. The polyolefin may be, for example, polyethylene or polypropylene. The plastic separator may be in physical contact with the gadolinium layer on one surface and with the semiconductor layer on the other surface.

The conversion layer 140, 240 comprises gadolinium. The conversion layer may be a gadolinium metal foil or a coating layer on the first semiconductor device. The coating layer may have a thickness of from about 20 to about 40 μm. Thinner coating layers may not be sufficiently thick for neutron capture. Thicker coating layers may lead to the capture of electrons.

Gadolinium has a high stopping power (Z=64) which leads to gamma-ray sensitivity. This sensitivity can lead to contamination of a neutron detection signal. Two types of radiation that are of concern are external gamma-rays and the high yield of internal K X-rays at 43 keV that are emitted when gadolinium is activated by gamma rays.

The second semiconductor device 120, 220 may include a second substrate and second semiconductor layer. The second substrate may be a sapphire substrate and the second semiconductor layer may be a GaN semiconductor layer. In other embodiments, other substrate and/or semiconductor materials (e.g., silicon or silicon carbide) may be included.

In some embodiments, the first semiconductor device 110, 210 and the second semiconductor device 120, 220 are identical. In other words, the semiconductor devices include the same layers, the same materials, and the same dimensions.

The substrates may be epitaxial substrates upon which the semiconductor layers are grown. Molecular beam epitaxy may be conducted to deposit the semiconductor material. The semiconductor layer may be grown via metal-organic chemical vapor deposition (MOCVD) or hydrogen vapor phase epitaxy (HVPE). The conversion layer may be deposited via any suitable gadolinium deposition method, including but not limited to sputtering.

When an external voltage is applied to each semiconductor device, a current subtraction calculation may be performed such that the current generated by electron-hole pairs that are activated by internal conversion electrons may be isolated. The external voltage may be applied with reverse bias, i.e. the n-type contact may be connected to the positive terminal.

The neutron detection devices and methods of the present disclosure may be used to detect thermal neutrons or fast neutrons, typically the fission neutrons at 1 MeV. Fast neutrons are higher energy neutrons than thermal neutrons. Thermal neutrons exhibit an average energy of about 0.025 eV at room temperature.

Gadolinium has a relatively short attenuation length (7 μm) for thermal neutrons and a large thermal neutron capture cross-section. Neutron capture cross-section measures the probability of interaction between a neutron and a target nucleus. Natural gadolinium has a thermal neutron capture cross-section of about 49,000 barns. Natural gadolinium also includes about 15.65% of $^{157}$Gd isotope which has a capture cross-section of about 254,000 barns, or about 65 times larger than the cross-section for the $^{10}$B(n,α)$^7$Li reaction. The gadolinium included in the devices of the present disclosure may be natural gadolinium or may be enriched $^{157}$Gd up to 99%.

The two most abundant isotopes of gadolinium and their corresponding nuclear reactions induced by thermal neutrons are described in the following reactions:

$n + _{64}^{157}Gd \rightarrow _{64}^{158}Gd^* \rightarrow _{64}^{158}Gd + \gamma +$ conversion electron+7.9 MeV,σ=253,929$b$ $n + _{64}^{155}Gd \rightarrow _{64}^{156}Gd^* \rightarrow _{64}^{156}Gd + \gamma +$ conversion electron+8.5 MeV,σ=60,800$b$ For example, following the absorption of a neutron by the $^{157}$Gd nucleus, several isomeric transitions occur, which result in the release of an average of 3.288 photons. These photons have a wide range of energies with a mean of 2.394 MeV. The 7.9 MeV value referred to in the equation above can be calculated by multiplying the average number of photons released by the mean photon energy. A large number of internal conversion electrons are emitted due to the large change in angular momentum of the low-lying excited states of $^{158}$Gd*. Following internal conversion, the gadolinium atom relaxes to the ground state by emitting Auger electrons and characteristic X-rays.

The most intense internal conversion electrons emitted during de-excitation of $^{158}$Gd* and $^{156}$Gd* are listed in the table below:

| IC electron energy (KeV) from $^{158}$Gd* | Yield per Neutron | IC electron energy (keV) from $^{156}$Gd* | Yield per Neutron |
|---|---|---|---|
| 29 | 0.0982 | 39 | 0.0419 |
| 71 | 0.268 | 81 | 0.0497 |
| 78 | 0.0617 | 88 | 0.0116 |
| 131 | 0.0341 | 149 | 0.0084 |
| 173 | 0.0146 | 191 | 0.003 |
| 180 | 0.0031 | 198 | 0.0006 |
| 228 | 0.004 | 246 | 0.0002 |
| Total yield | 0.4837 | Total yield | 0.1154 |

The fast (1 MeV) neutron capture cross-section of gadolinium (7.5 barns) is also significantly greater than that of $^{10}$B (0.15 barns).

Unlike neutron conversion reactions in $^{10}$B, $^{6}$Li, and $^{3}$He, no ions are typically emitted when a gadolinium atom captures a neutron. While no heavy particles are typically emitted when $^{157}$Gd absorbs a neutron, the $^{158}$Gd atom produced is in an excited state and releases gamma-rays (390 spectrum lines), x-rays, internal conversion electrons, and Auger electrons. The energy of an emitted internal conversion electron depends on which shell (e.g. K, L, M, or N) the electron is from. K-N shell electrons are emitted with energies in the range of 29-228 keV. Within this range, 71 keV fast electrons are prominent information carriers for subsequent ionization to create electron-hole pairs. The mean free path of 71 keV fast electrons is about 20 μm in GaN which makes GaN particularly useful in neutron detection devices.

FIG. 1 illustrates thermal neutron detection in an exemplary device 100 of the present disclosure. Thermal neutrons 150 can be absorbed by gadolinium atoms 142 in the gadolinium-containing layer 140 of the device 100. The excited gadolinium atoms 142 emit internal conversion electrons 160 and prompt gamma-rays 165. The second semiconductor 120 is isolated from internal conversion electrons 160 by the electron separator layer 130. Background gamma-rays 155 and gamma-rays emitted by gadolinium 165 may pass through the electron separator layer 130. However, internal conversion electrons 160 emitted by gadolinium atoms 142 when neutrons 150 are absorbed are inhibited from reaching the second semiconductor 120.

By calculating the difference in signals between the first semiconductor 110 and the second semiconductor 120, the signal from internal conversion electrons 160 may be isolated. Neutrons 150 may be detected and/or an amount of neutrons 150 may be determined based on the signal from the internal conversion electrons 160. The following equations describe how the internal conversion electron 160 signal is isolated in thermal neutron detection mode:

$$\begin{aligned}\text{Detector output} &= \text{signal from first semiconductor 110} - \text{signal} \\ &\quad \text{from second semiconductor 120} \\ &= (\text{signal from internal conversion electrons 160} \\ &\quad + \text{signal from background } \gamma\text{-rays 155} \\ &\quad + \text{signal from emitted } \gamma\text{-rays 160}) - (\text{signal} \\ &\quad \text{from background } \gamma\text{-rays 155} + \text{signal} \\ &\quad \text{from emitted } \gamma\text{-rays 160}) \\ &= \text{signal from internal conversion electrons 160.}\end{aligned}$$

The signal from the second semiconductor 120 may also be used for gamma ray detection.

FIG. 2 illustrates fast neutron detection in an exemplary device 200 of the present disclosure. In fast neutron detection, the electron separator layer 230 functions as a proton radiator. In other words, the electron separator layer 230 can emit a recoil proton 270 when bombarded with a fast neutron 251. Only the second semiconductor 220 will be exposed to the recoil proton 270 due to the forward scattering nature of the recoil proton 270. By calculating the difference in signals between the first semiconductor 210 and the second semiconductor 220, the signal from recoil protons 270 may be isolated. Neutrons 251 may be detected and/or an amount of neutrons 251 may be determined based on the signal from the recoil protons 270. The following equations describe how the recoil proton 270 signal is isolated in fast neutron detection mode:

$$\begin{aligned}\text{Detector output} &= \text{signal from second semiconductor 220} - \text{signal} \\ &\quad \text{from first semiconductor 210} \\ &= (\text{signal from recoil protons 270} + \text{signal from} \\ &\quad \text{emitted } \gamma\text{-rays 265} + \text{signal from background} \\ &\quad \gamma\text{-rays 255}) - (\text{signal from internal} \\ &\quad \text{conversion electrons 260} + \text{signal from} \\ &\quad \text{emitted } \gamma\text{-rays 265} + \text{signal from background} \\ &\quad \gamma\text{-rays 255}) \\ &= \text{signal from recoil protons 270} - \text{signal from} \\ &\quad \text{internal conversion electrons 260} \\ &\approx \text{signal from recoil protons 270.}\end{aligned}$$

The signal from internal conversion electrons is not completely eliminated because gadolinium has a fast neutron absorption cross-section of about 7.5 barns for 1 MeV neutrons. The pulse shape, particularly the pulse height, due to the recoil proton 270 and the internal conversion electron 260 will be very different. The gross signal proportional to fast neutron intensity from the first semiconductor 210 may serve as a gate signal to switch the subtraction circuit. This signal may also be a good indicator for total fast neutron 251 intensity.

The signals may be voltage signals generated when incident radiation is instantaneously converted to a burst of charge (the time integral of current). The original signal in the detection device may be amplified. In some embodiments, the original signal produced due to a neutron interaction is on the order of femtocoulombs and is converted via a preamplifier circuit to generate a detectable voltage pulse on the order of millivolts.

Figure 3:
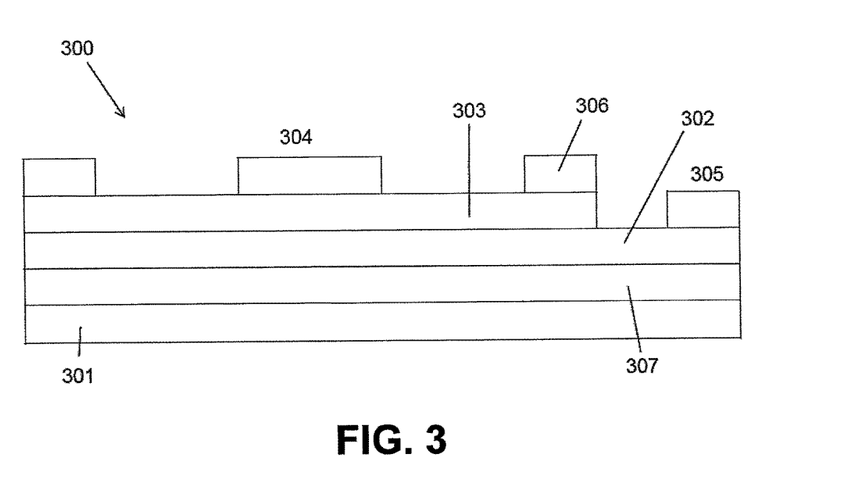
FIG. 3 is an illustration of a Schottky diode which may be used in an exemplary detection device of the present disclosure.

FIG. 3 illustrates an exemplary Schottky semiconductor device 300 which may be used in the detection devices of the present disclosure. The device 300 includes a substrate 301, an optional template layer 307, a semiconductor layer 302, a gadolinium-containing layer 303, an ohmic contact 305, and a Schottky contact 304. The device 300 further includes a guard ring 306 in some embodiments.

The ohmic contact 305 may be an n-type contact (e.g., an indium electrode) and be connected to a positive terminal of a voltage source. The Schottky contact 304 may be a p-type contact and be connected to the negative terminal of the voltage source. In some embodiments, the p-type contact is a dual layer titanium/gold (Ti/Au) contact.

The template layer 307 may be a metal nitride layer (e.g., an aluminum nitride (AlN) layer) which aids in the growth of the semiconductor layer 302.

The semiconductor layer 302 may comprise any suitable semiconductor material. In some embodiments, the semiconductor layer 302 contains gallium nitride.

The semiconductor device that does not include a gadolinium-containing layer may have a similar structure. In some embodiments, this device includes a pure semiconductor (e.g., GaN) epitaxial layer in place of the gadolinium-containing layer. The n-type contact may be located on the semiconductor layer. The p-type contact may be located on the epitaxial layer.

Devices and methods for detecting gamma rays are also disclosed. The devices may include a semiconductor device including a semiconductor layer and a conversion layer comprising gadolinium disposed over the semiconductor layer. The gadolinium converts high and/or medium energy gamma rays into low energy K x-rays. The gamma ray detection device generally includes a single semiconductor device. Since the signal generated by K x-rays does not experience a high level of interference, isolation is not required for detection.

The semiconductor layer is almost transparent to high and medium energy gamma rays. However, the gadolinium conversion layer converts the gamma rays to low energy K x-rays which allows detection of the gamma rays by the gamma ray detection device. Conversion occurs if a high energy gamma ray interacts with a gadolinium atom in the conversion layer and ionizes the K-shell of the atom. The excited gadolinium atom emits a characteristic K x-ray, which is at a low energy region with the most intense peak at 43 keV, to return to its ground state.

The following examples are for purposes of further illustrating the present disclosure. The examples are merely illustrative and are not intended to limit the disclosure to the materials, conditions, or process parameters set forth therein.

EXAMPLES

Example 1

An array included eight detectors. The detectors included silicon semiconductors and were placed on individually adjustable detector mounts and arranged to obtain annular views of the sample with the same solid angle. The detectors had the following specifications:

| Model | ULTRA ion implanted (model: U016-300-100) |
|---|---|
| Contact | 500 Å |
| Active Area | 300 mm$^2$ |
| Minimum Depletion Depth | 100 μm |
| Resolution (FWHM) | 16 keV @ 5.486 MeV alpha |

The detectors and eight preamplifiers were placed in a stainless steel right circular cylinder (61 cm×61 cm in size) and a vacuum of $10^{-6}$ Torr was maintained during the experiments.

A thermal neutron beam (10 mm in diameter) provided neutrons at a 500 kW thermal, light water, and pool-type reactor. The reactor operated at 5 kW for this measurement and delivered a thermal equivalent neutron flux of about $8.6 \times 10^4$ cm$^{-2}$-s$^{-1}$ and a gamma dose rate of about 25 mR h$^{-1}$.

A thin Gd foil (1.25 cm×1.25 cm×0.0025 cm) was mounted on the sample holder inside the vacuum chamber. Two of the eight Si charged particle detectors were covered with 350 μm thick polyethylene caps to shield them from internal conversion electrons. The remaining six Si charged particle detectors were left unshielded.

Detector signals were acquired from eight independent detector channels using digitizer-based data acquisition electronics. A programmable trapezoidal energy filter was used to process the digitized pulses and enabled precise determination of the pulse height. Data was acquired in list mode, in which the time stamp and pulse height corresponding to each detected event were recorded and stored on a host PC. The data was analyzed offline to generate histograms of the detector pulse height with appropriate bin widths.

The energy spectra of each of the six uncovered Si detectors were identical. Similarly, the energy spectra of each of the two covered Si detectors were identical. However, the energy spectra for these two groups differed. In the spectra of the uncovered detectors, a broad peak having a centroid at about 71 keV was noted. Two less intense peaks were also observed at about 131 keV and 173 keV for the uncovered detector. The peak broadening was partially attributable to the fact that internal conversion electrons (29-87 keV) lose energy when escaping the Gd foil before reaching the Si detector. Such peak broadening could be utilized to measure the thickness of a Gd thin film deposited on a foreign substrate.

The energy spectra from the covered detectors indicated that the 350 μm thick polyethylene layer completely blocked the internal conversion electrons while still permitting some low-energy gamma rays into the detector. A lower-level threshold of 23.3 keV was set in the pulse height analysis for the Si detectors, which rejected radiations with energies of 23.3 keV and below.

The experimental measurements indicated that the spectra from the bare (i.e., uncovered) detectors can be attributed to mixed internal conversion electrons and gammas rays, whereas the spectra from the covered detectors resulted from gamma rays only.

Example 2

Monte Carlo simulations were conducted using Monte Carlo N-Particle Transport Code (MCNP5) and Software for Optimization of Radiation Detectors (SWORD) in order to observe the internal conversion electron energy spectrum following thermal neutron absorption in Gd. A beam of 0.0253 eV thermal neutrons was perpendicularly incident on a 10 µm thick natural Gd foil and a 200 µm thick silicon detector was used to tally the energy deposition of the Gd(n,γ)Gd* reaction products. An internal conversion electron source was created in the Gd foil for MCNP5 simulation.

A comparison of the spectra obtained by MCNP5 and SWORD revealed a close resemblance between these simulations and similarity to the results of Example 1.

Example 3

A SWORD simulation was carried out using the setup illustrated in FIG. 1. The Gd-containing layer was a 10 µm thick foil. The separator was a 100 µm thick polyethylene separator. The detectors were both 200 µm thick Si detectors.

The internal conversion electron results resembled both the experimental results of Example 1 and the simulation results of Example 2 despite a slightly different geometry.

Example 4

Gamma-ray interactions were simulated using MCNP5 for the twin detector setup described in Example 3. Gamma rays emitted by $^{57}$Co were used as the source particles in this example. $^{57}$Co was selected to demonstrate the sensitivity of a detector to low-energy gamma rays. The detector response included the two $^{57}$Co gamma peaks (122.0 keV and 136.5 keV) and KX-ray peaks (42.3 keV and 43.0 keV) from gamma activation of Gd. The spectrum from the uncovered detector included features at about 50-75 keV and about 80-120 keV that could be attributed to energy deposition of the photoelectrons ejected from Gd following photoelectric absorption of 122 keV photons. The polyethylene layer completely stopped these electrons from reaching the covered detector and thus these features we not present in the spectrum from that detector. Subtracting these two spectra significantly reduces the overall gamma-ray response.

Example 5

To validate the simulation results of Example 4, an experiment was designed using two silicon detectors of the type described in Example 1 and a $^{57}$Co gamma-ray button-size source. A 25 µm thick Gd foil and a 350 µm thick polyethylene cap were used to separate the two Si detectors. A multichannel digitizer-based acquisition system was used for simultaneous signal acquisition from two independent detector channels. Energy spectra from each detector were acquired using the digitizer with a trapezoidal energy filter. The gamma ray response of the covered detector was lower than that of the uncovered detector except in the low-energy region. This attenuation was attributed to the point-source-like geometry used in the experiment. In other words, the detector that is close to the source has a higher solid angle. In contrast, a collimated source was used in the simulation and both detectors had the same solid angles. Although the detector responses are not identical, two gamma spectra present the same shape and the subtraction of the two energy spectra significantly reduces the gamma-ray component of the resulting spectrum.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:

1. A detection device comprising:
a first semiconductor device;
a second semiconductor device;
an electron separator layer between the first semiconductor device and the second semiconductor device; and
a conversion layer between the first semiconductor device and the second semiconductor device;
wherein the conversion layer comprises gadolinium;
wherein the conversion layer has a thickness of from about 20 µm to about 40 µm;
wherein the electron separator layer comprises a first surface and a second surface; and
wherein the first surface is in physical contact with the conversion layer.

2. The detection device of claim 1, wherein the conversion layer is a coating layer deposited on the second semiconductor device.

3. The detection device of claim 1, wherein the conversion layer is a gadolinium-doped superlattice.

4. The detection device of claim 1, wherein the electron separator layer comprises polyethylene.

5. The detection device of claim 1, wherein the second surface is in physical contact with one of the first semiconductor device and the second semiconductor device.

6. The detection device of claim 1, wherein the first semiconductor device and the second semiconductor device comprise gallium nitride.

7. The detection device of claim 1, wherein the electron separator layer comprises a polyolefin.

8. The detection device of claim 1, wherein the device only contains one conversion layer.

9. A method for detecting neutrons, comprising:
providing a detection device comprising:
a first semiconductor device;
a second semiconductor device;
an electron separator layer between the first semiconductor device and the second semiconductor device; and
a conversion layer between the first semiconductor device and the second semiconductor device;
wherein the conversion layer comprises gadolinium;
wherein the conversion layer has a thickness of from about 20 µm to about 40 µm;
wherein the electron separator layer comprises a first surface and a second surface; and
wherein the first surface is in physical contact with the conversion layer;
applying a first, reverse bias voltage to the first semiconductor device and a second, reverse bias voltage to the second semiconductor device; and
comparing a first signal from the first semiconductor device to a second signal from the second semiconductor device to detect neutron radiation.

10. The method of claim 9, wherein the electron separator layer comprises polyethylene.

11. The method of claim 9, wherein the second surface is in physical contact with one of the first semiconductor device and the second semiconductor device.

12. The method of claim 9, wherein the first semiconductor device and the second semiconductor device comprise gallium nitride.

13. The method of claim 9, wherein the electron separator layer comprises a polyolefin.

14. A method for detecting gamma radiation, comprising:
   providing a detection device comprising a first semiconductor device and a conversion layer disposed on the semiconductor device, wherein the conversion layer comprises gadolinium;
   applying a reverse bias voltage to the semiconductor device; and
   measuring a signal generated by K x-rays to determine the intensity of gamma radiation.

15. The method of claim 14, wherein the conversion layer has a thickness from about 20 to about 40 μm.

16. The method of claim 14, wherein the conversion layer has a thickness of from about 20 μm to 25 μm.

17. The method of claim 14, wherein the conversion layer has a thickness of from 25 μm to about 40 μm.

18. The method of claim 14, wherein the detection device further comprises a second semiconductor device and an electron separator layer; and wherein the electron separator layer and the conversion layer reside between the first semiconductor device and the second semiconductor device.

19. The method of claim 14, wherein the electron separator layer comprises a polyolefin.

20. The method of claim 14, wherein the electron separator layer comprises polyethylene.

* * * * *

UNITED STATES PATENT AND TRADEMARK OFFICE
CERTIFICATE OF CORRECTION

PATENT NO. : 9,851,454 B2  
APPLICATION NO. : 14/381764  
DATED : December 26, 2017  
INVENTOR(S) : Lei Cao Page 1 of 1

It is certified that error appears in the above-identified patent and that said Letters Patent is hereby corrected as shown below:

In the Specification

Column 1, Line 10 add Government Support Clause "This invention was made with government support under grant number HDTRA1-11-1-0013 awarded by the Department of Defense Threat Reduction Agency. The government has certain rights in the invention."

Signed and Sealed this  
Sixth Day of October, 2020

Andrei Iancu  
*Director of the United States Patent and Trademark Office*